(12) United States Patent
Yamasaki et al.

(10) Patent No.: US 7,077,170 B2
(45) Date of Patent: Jul. 18, 2006

(54) METHOD OF FORMING LEADS OF A SEMICONDUCTOR DEVICE

(75) Inventors: Hidetaka Yamasaki, Hyogo (JP); Itaru Matsuo, Tokyo (JP); Hidekazu Manabe, Tokyo (JP); Kenji Imamura, Tokyo (JP); Kenichirou Katou, Hyogo (JP); Mitsutaka Matsuo, Hyogo (JP)

(73) Assignees: Renesas Technology Corp., Tokyo (JP); Renesas Device Design Corporation, Itami (JP)

( * ) Notice: Subject to any disclaimer, the term of this patent is extended or adjusted under 35 U.S.C. 154(b) by 353 days.

(21) Appl. No.: 10/613,989

(22) Filed: Jul. 8, 2003

(65) Prior Publication Data

US 2005/0076967 A1 Apr. 14, 2005

(30) Foreign Application Priority Data

Jan. 7, 2003 (JP) .............................. 2003-001242

(51) Int. Cl.
*B21F 1/00* (2006.01)
(52) U.S. Cl. .................................... 140/105
(58) Field of Classification Search ................ 140/105
See application file for complete search history.

(56) References Cited

U.S. PATENT DOCUMENTS

| 3,812,703 | A | * | 5/1974 | Tepper | ......................... 72/326 |
| 4,644,633 | A | * | 2/1987 | Jones et al. | ................. 29/566.3 |
| 5,105,857 | A | * | 4/1992 | Ellis | ........................... 140/105 |
| 5,158,121 | A | * | 10/1992 | Ishii | ........................... 140/105 |
| 5,222,528 | A | * | 6/1993 | Downing | ..................... 140/105 |
| 5,860,455 | A | | 1/1999 | Ishii | |
| 5,950,687 | A | * | 9/1999 | Manabe et al. | .............. 140/105 |

FOREIGN PATENT DOCUMENTS

| JP | 60-99033 U | 7/1985 |
| JP | 6-47445 | 2/1994 |
| JP | 10-163396 | 6/1998 |

* cited by examiner

*Primary Examiner*—Lowell A. Larson
(74) *Attorney, Agent, or Firm*—Leydig, Voit & Mayer, Ltd.

(57) ABSTRACT

In a lead forming apparatus for a semiconductor device, a holder holds a semiconductor device with leads to be formed, the semiconductor device having leads extending from a package. Two die assemblies (for bending, for cutting, or the like) are set in parallel, each including top and bottom dies matched with each other. A mover changes relative distance between the two die assemblies. The top and bottom dies in the two die assemblies are positioned so the leads of the semiconductor device held on the holder are between the dies.

8 Claims, 10 Drawing Sheets

METHOD OF FORMING LEADS OF A SEMICONDUCTOR DEVICE

BACKGROUND OF THE INVENTION

1. Field of the Invention

The present invention relates to lead forming of a semiconductor device.

2. Description of Prior Art

A semiconductor device has leads extending through two sides of a resin package. In a fabrication process of semiconductor device, the leads are formed after the semiconductor device is covered with a resin. For example, when gull-wing type leads are formed in a prior art process, a semiconductor device, after being covered with a resin, is put between top and bottom dies for preliminary bending, so that lead parts extending from the two sides of the semiconductor device are bent in a press. Next, the semiconductor device is put between top and bottom dies, so that distal portions of the lead parts are bent in the reverse direction in a press. Then, the semiconductor device having the gull-wing leads is put between top and bottom dies for adjustment, to produce a final form.

In the above-mentioned lead forming, when the type of semiconductor device is changed or even if the type is not changed, but the shape of the leads is changed, all of the three die assemblies have to be replaced. That is, the dies are needed for each lead shape of semiconductor device. Therefore, much capital investment, labor and time are needed.

In the above-mentioned lead forming, exclusive die assemblies each consisting of top and bottom dies are necessary according to a size of a work to be formed. Therefore, it is proposed to use a general die. For example, in the die disclosed in Japanese Utility Model laid open Publication 60-99033/1985 for bending a work such as a wire or a plate with press work, the position of a top die in a die assembly can be changed vertically. Furthermore, one of die assemblies provided at right and left sides can be moved horizontally with a screw. It is to be noted that lead forming of a semiconductor device is not described. Further, in an apparatus for bending disclosed in Japanese Patent laid open Publication 6-47445/1994, a die consists of a plurality of components, and one of them is movable. The shape of the die can be changed by moving the movable component. It is to be noted that the publication also does not describe lead forming of a semiconductor device. An apparatus for lead bending, disclosed in Japanese Patent laid open Publication 10-163396/1998, has a holder for holding the leads at bases thereof and another holder for holding them at edges thereof. When the bending form of lead is changed, the positions at the base and/or at the edge have to be changed. Then, the positions of the holders are adjusted, and the edges of the leads are moved like an arc so as to form the leads.

Furthermore, in the apparatuses disclosed in Japanese Utility Model laid open Publication 60-99033/1985 and Japanese Patent laid open Publications 6-99033/1994 and 10-163396/1998, the position or the like of a die can be changed according to a work to be processed. However, they cannot realize high precision of the order of for example one micrometer. For example, in the apparatuses shown in Japanese Utility Model laid open Publication 60-99033/1985 and Japanese Patent laid open Publications 6-99033/1994 do not form leads, and they do not take high precision into account, for example, by adjusting the die position with a screw. Furthermore, in the apparatus for lead bending shown in Japanese Patent laid open Publication 10-163396/1998, the die assembly for lead bending does not have a punch and a die. In the apparatus the lead portions are clamped at a base position and at a forming position, to enforce an arc trajectory so as to form the lead parts. However, such forming has low precision consequently. Further, these apparatuses only bent the lead portions, and they cannot deal with a complicated form of leads.

SUMMARY OF THE INVENTION

An object of the invention is to form lead parts of a semiconductor device at high precision even when the shape or the like of dies is changed according to the size of the semiconductor device.

In a lead forming apparatus for a semiconductor device according to the invention, a holder holds a semiconductor device to be formed, the semiconductor device having leads extending from a package thereof. Two die assemblies (for bending, for cutting or the like) are set in parallel, each comprising a pair of top and bottom dies matched with each other. A mover changes a relative distance between the two die assemblies. The top and bottom dies in the two die assemblies are positioned to interpose the leads of the semiconductor device held on said holder and form the leads between them. Preferably, a size of a semiconductor device is measured before lead forming thereof, and the positions of components in the lead forming apparatus is adjusted according to a difference between the measured size and a normal value. Then, the semiconductor device is formed with the adjusted apparatus. Alternatively, after lead forming of a semiconductor device, a size thereof is measured, and the lead forming apparatus is adjusted for lead forming for a next semiconductor device.

An advantage of the present invention is that a plurality of types of semiconductor devices can be formed by the above-mentioned lead forming apparatus.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
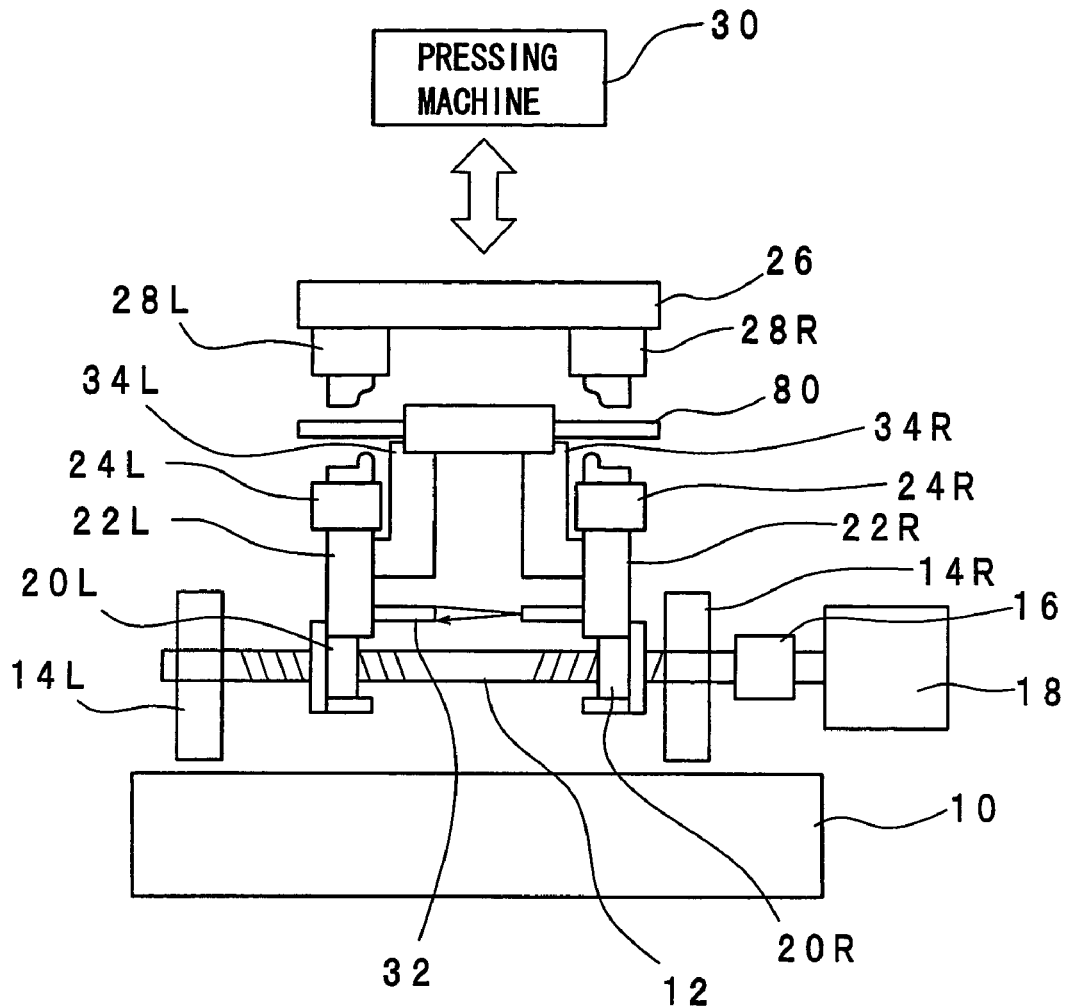
FIG. 1 is a front view of an apparatus for forming leads of a semiconductor device according to a first embodiment of the invention.

Referring now to the drawings, wherein like reference characters designate like or corresponding parts throughout the several views, embodiments of the invention are explained below. A lead forming apparatus for semiconductor devices has two sets of die assembly including a punch and a die for forming leads at a side of the device in parallel to each other. In order to form the leads at two sides of a semiconductor device, die assemblies of a punch and a die are positioned for bending, cutting or the like at two sides of the device. In the lead forming apparatus, the relative distance between the two sets of die assemblies can be changed by a mover or the like. Then, leads of a plurality of types of semiconductor devices can be formed by using the same die assemblies provided for the lead forming apparatus. Furthermore, the type of the semiconductor device can be changed automatically, and the capital investment for the dies can be reduced.

First Embodiment

FIG. 1 shows a lead forming apparatus according to the first embodiment of the invention. The affixes, "L" and "R", for the names of the components in the apparatus mean positions when viewed from a front side. A semiconductor device as a work to be processes by the lead forming apparatus has lead parts extended from two sides of a resin package thereof, and they are formed as a gull-wing type leads. When the lead shapes are the same and only the size of the resin package is different, the lead forming apparatus can bend the lead parts without changing the die assemblies, but by changing the relative distances of the two sets of die assemblies.

In the lead forming apparatus, a ball screw 12 provided above a base plate 10 and supported by bearings 14L and 14R is screwed in the reverse directions at the left and right sides when viewed from the front in FIG. 1. The ball screw 12 is connected at an end thereof with a coupling 16 connected further to a motor 18. Thus, the ball screw 12 is rotated by driving the motor 18. Left and right screws provided for the ball screw 12 at the left and right sides thereof are engaged with nuts 10L and 20R, and tables 22L and 22R are fixed to the nuts 10L and 20R. A left bottom die 24L is mounted on the table 22L, while a right bottom die 24R is mounted on the table 22R. Top dies 28L and 28R supported by a top platen 26 oppose the bottom dies 24L and 24R. The top platen 26 is pressed down by a pressing machine 30. The top and bottom dies 28L and 24L at the left side and those 28R and 24R at the right side have shapes in correspondence with a pair of punch and die engaging with each other, respectively. Thus, the lead forming apparatus includes two pairs of die assemblies each consisting of the top and bottom dies 28L and 24L, 28R and 24R. Furthermore, a sensor 32 is fixed on opposing sides of the tables 22L and 22R so as to measure the relative distance between the bottom dies. The sensor 32 shown in FIG. 1 is an optical sensor, and an arrow shows schematically an optical path. Still further, device holders 34L and 34R are also fixed to the tables 22L and 22R. The device holders 34L and 34R holds a semiconductor device 80 at a predetermined position. In the lead forming apparatus, each of the left and right dies forms lead parts extending from a side of the semiconductor device 80, or the lead parts at the two sides of the semiconductor device are formed at the same time.

Figure 2:
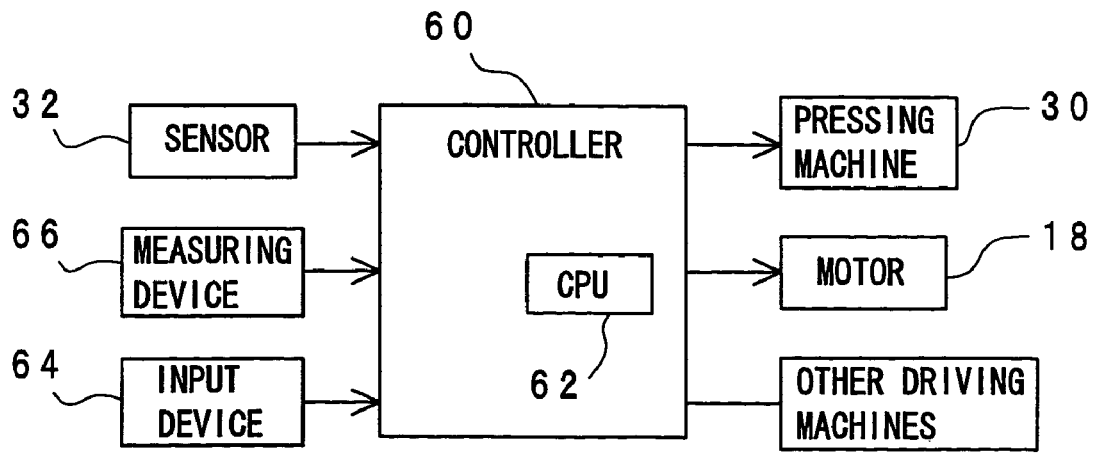
FIG. 2 is a diagram of a controller therefor.

As shown in FIG. 2, a central processing unit (CPU) 62 in the controller 60 controls the lead forming apparatus. On operation, the controller 62 acquires signals from the signals 32 and receives setting of a desired position from an input device 64 instructed by an operator. Then, it drives the motor 18 according to a difference of the current and desired positions to rotate the ball screw 12. Therefore, the relative distance between the dies can be adjusted according to the setting of the desired position. In other embodiments, a suitable measuring device may be provided at different positions of the dies. The dies can be moved automatically according to the difference of the measurement data with a desired position by using a driver for moving the dies.

In the lead forming apparatus, when the motor 18 rotates the ball screw 12 to move the nuts 20L and 20R, the nut 20L and the table 22L are moved towards or away from the nut 20R and the table 22R. That is, the relative distance between the two pairs of dies is changed by rotating the ball screw 12. Therefore, the relative distance is set by controlling the ball screw 12. Alternatively, by providing ball screws at the left and right sides, the dies at the left and right sides can be moved independently.

Figure 3:
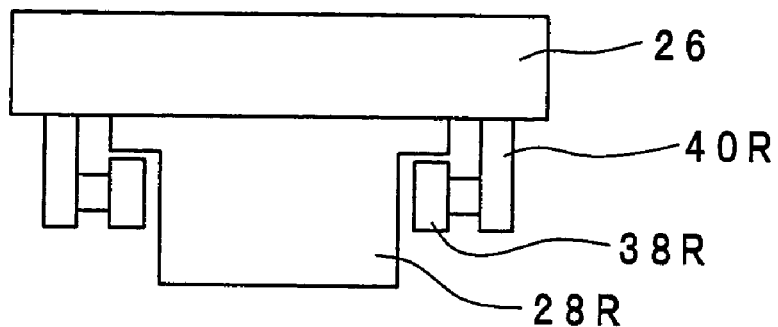
FIG. 3 is a part of a side view of the apparatus shown in FIG. 1.

The top dies 28L and 28R make contact closely to the platen 26, but they are not fixed thereto. This makes top dies 28L and 28R follow the shift of bottom dies 24L and 24R by the ball screw 12. FIG. 3 shows a side view of the platen 26 and one of the top dies 28R. In the example shown in FIG. 3, a pair of guide rollers 38R holding the top die 28R is supported by a pair of plates 40R fixed to two sides of the platen 26. Thus, the top die 28R is supported by the pair of guide rollers 38R fixed to the platen 26, while it is moved freely to the left and right directions in FIG. 1. The other top die 28L is supported similarly.

A semiconductor device 80 with lead parts extended to the right and left directions from a resin package thereof are put by a carrier (not shown) on the device holders 34L and 34R provided at the right and left sides. The device holders 34L and 34R hold a shoulder of the resin package, so that the semiconductor device 80 is put at a predetermined position between the top and bottom dies. At the position, lead parts at one of sides of the resin package of the semiconductor device 80 are positioned between the left top and bottom dies 28L and 24L, while lead parts at the opposite side thereof are positioned between the right top and bottom dies 28R and 24R. In the lead forming, the lead parts held on the device holders are formed by pressing the platen 26 downward by the pressing machine 30.

Figure 4:
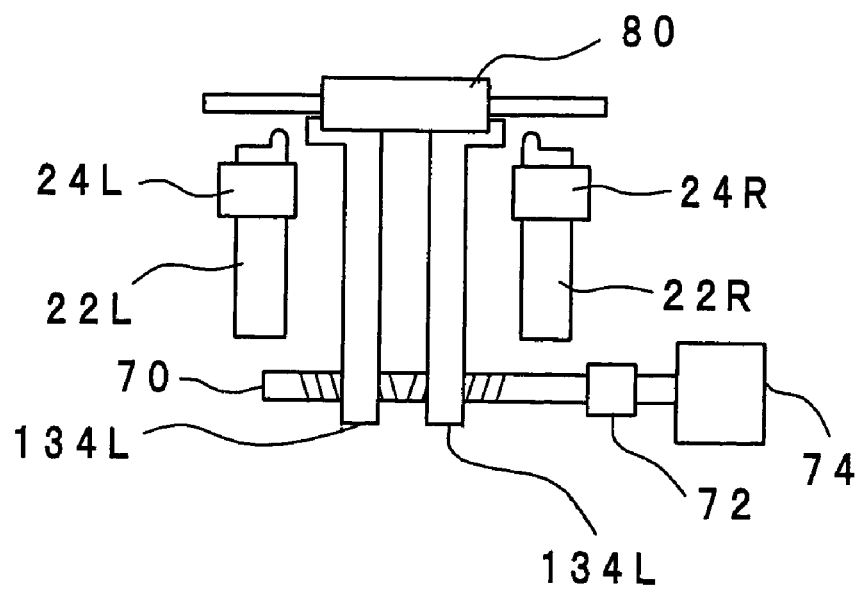
FIG. 4 is a diagram of an example of a device holder.

In another example shown in FIG. 4, device holders 134L and 134R are provided instead of the device holders 34L and 34R shown in FIG. 1. The device holders 134L, 134R are engaged with a drive axis (ball screw) 70, and the distance between them is adjusted by a servo motor 74 connected via a coupling 72 to the drive axis 70. Furthermore, similarly to the dies shown in FIG. 1, a sensor (not shown) is provided to measure the relative distance between them. The drive shaft 70 is positioned for example at the depth side of the ball screw 12 shown in FIG. 1. In this example, the controller 60 also controls the servo motor 74. Therefore, the holding position can be adjusted according the package size of the semiconductor device independently of the relative distance between the left and right dies. Alternatively, the device holder is integrated with a different component.

Figure 5:
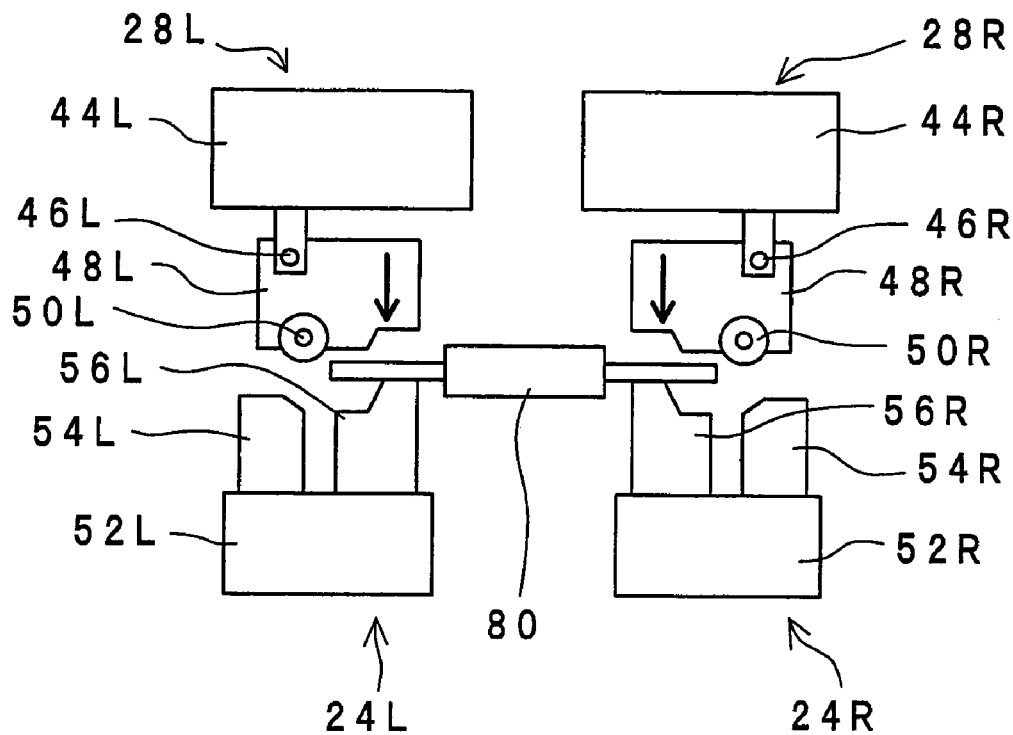
FIG. 5 is a part of a front view of the apparatus shown in FIG. 1.

FIG. 5 shows the top dies 28L, 28R and the bottom dies 22L, 22R in detail. At the left top die 28L, a top holder 44L supports a punch 48L at a fulcrum 46L. Still further, the punch 48L has a roller 50L at the bottom thereof. At the right bottom die 24L, a cam plate 54L and a die 56L are fixed on a bottom holder 52L. Similarly, at the right top die 28R, a top holder 44R supports the punch 48R at a fulcrum 46R. Still further, the punch 48R has a roller 50R at the bottom thereof. At the right bottom die 24R, a cam plate 54R and a die 56R are fixed on a bottom holder 52R. The punch 48L, 48R pivots around the fulcrum 46L, 46R, and the roller SOL, 50R makes contact rotatably with a shoulder or taper formed obliquely to lead the roller SOL, 50R towards the inside on the top of the cam plate 54L, 54R. The shapes of the bottom of the punches 48L, 48R and of the top of the dies 56L, 56R are designed to form gull-wing leads of the semiconductor device 80 between them. Though not shown, the device holders 34L, 34R for holding the device 80 are fixed to the dies 56L, 56R.

The operation of the above-mentioned apparatus is explained. First, in order to set the relative distance between two pairs of die assemblies, the left and right bottom and bottom dies 24L, 28L, 24R, 28R are moved by the ball screw 12 according to the desired size for the semiconductor device 80. Next, the semiconductor device 80 is set by a carrier (not shown) on the device holders 34L, 34R at the predetermined position. Next, the platen 26 driven by the pressing machine 30 moves the top dies 28L, 28R downward (as shown with arrows in FIG. 5). When the platen 26 is moved further downward while the rollers 50L, 50R make contact with the shoulders of the cam plates 56L, 56R, and the top holders 44L, 44R held by the guide roller 38L, 38R are moved to the inside.

The top dies 28L, 28R in contact with the leads of the semiconductor device 80 are moved to a bottom dead center by the platen 26 driven by the pressing machine 30. At this time, the punches 48L, 48R are moved around the fulcrum 46L, 46R to the predetermined position by the contact and rotation of the roller 50L, 50R and the cam plate 54L, 54R. Thus, the semiconductor device 80 has the desired shape at the position of bottom dead center according to the engagement of the punch 48L, 48R with the die 56L, 56R (refer to FIG. 6). The semiconductor device at the bottom dead center is called as as-formed semiconductor device 81.

Figure 7:
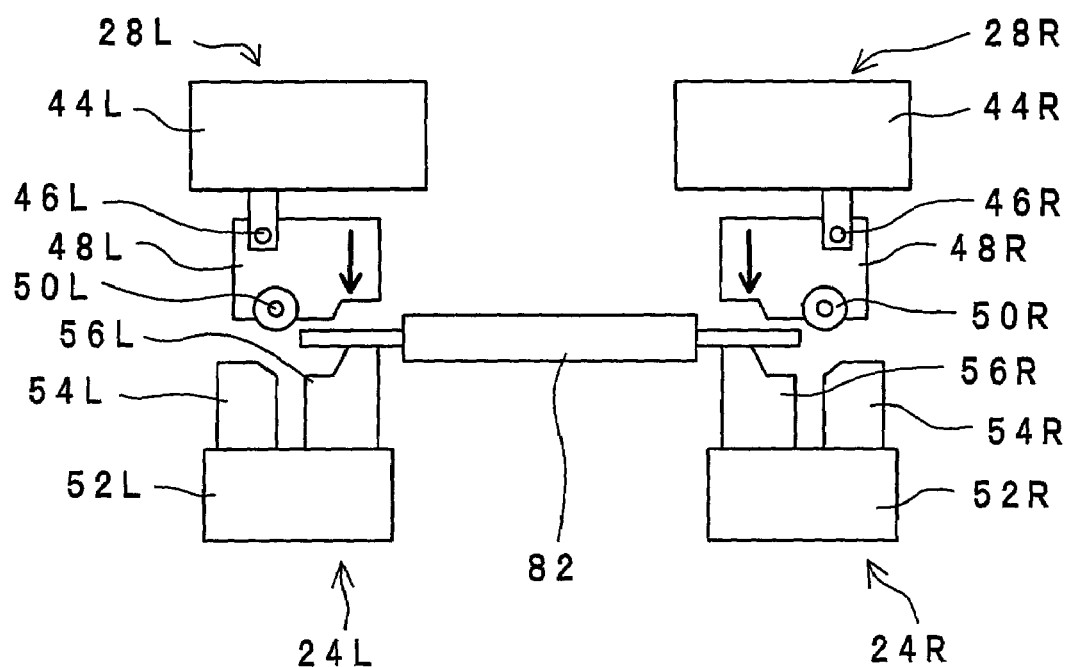
FIG. 7 is a diagram for explaining fabrication of semiconductor devices of different sizes.
Figure 8:
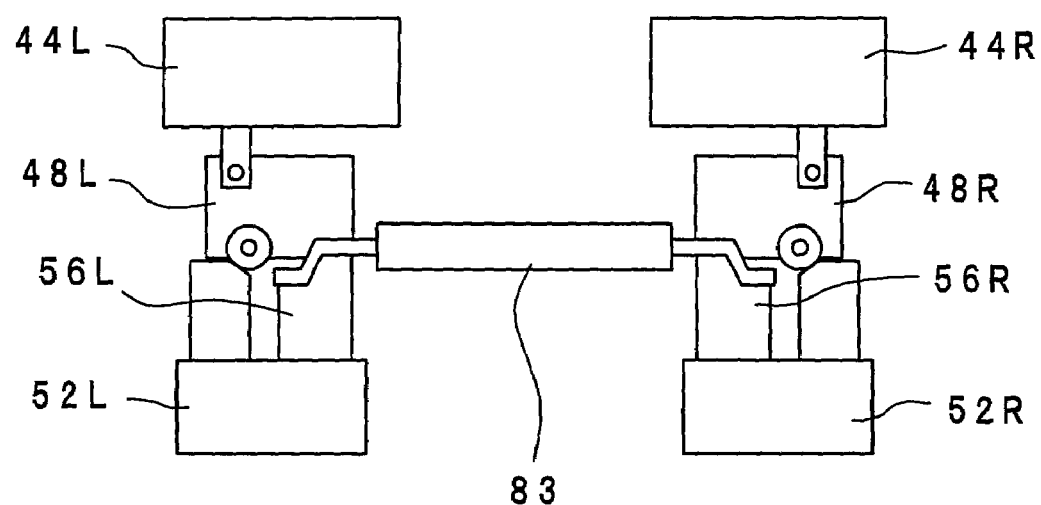
FIG. 8 is a front view of a process in the apparatus shown in FIG. 7.

As shown in FIG. 7, when a semiconductor device having the same shape of the lead parts as the above-mentioned one 80, but having a different size thereof (for example a semiconductor device 82 shown in FIG. 7) is formed in the lead forming apparatus, the ball screw 12 is driven by the motor 18 according to a size of the semiconductor device 82 to move the left and right top and bottom dies 28L, 24L, 28R, 24R while confirming the position of the dies 24L, 24R with the sensor 32. The change of the positions of the dies 28L, 24L, 28R and 24R is performed just before the engagement thereof by the pressing machine 30 because they form an apparent single die at this position such that the left top die 28L engages with the left bottom die 24L and that the right top die 28R engages with the right bottom die 24R. Then, the semiconductor device 82 is set by a carrier (not shown) at the desired position. Next, the top dies 28L, 28R and the bottom dies 24L, 24R are moved downward by the platen 26 pressed by the pressing machine 30. As shown in FIG. 7, the top dies 28L and 28R in contact with the semiconductor device 82 are moved further to the bottom dead center by the platen 26 pressed by the pressing machine 30. At this time, the left punch 48L is moved around the fulcrum 46L to the predetermined position according to the contact and rotation of the roller 50L with the cam plate 54L, so that the lead parts of the semiconductor device 82 are formed to have the desired sizes at the bottom dead center by the punch 48L and the die 56L. At the same time, the right punch 48R is moved around the fulcrum 46R to the predetermined position according to the contact and rotation of the roller 50R with the cam plate 54R, so that the lead parts of the semiconductor device 82 are formed to have the desired sizes at the bottom dead center by the punch 48R and the die 56RL. The semiconductor device at the bottom dead center is an as-formed semiconductor device 83.

Second Embodiment

Next, a lead forming apparatus according to the second embodiment of the invention is explained. The lead forming apparatus is similar to that of the first embodiment except the internal structure of the dies. It can adjust the height of the cam at the bottom die.

Figure 9:
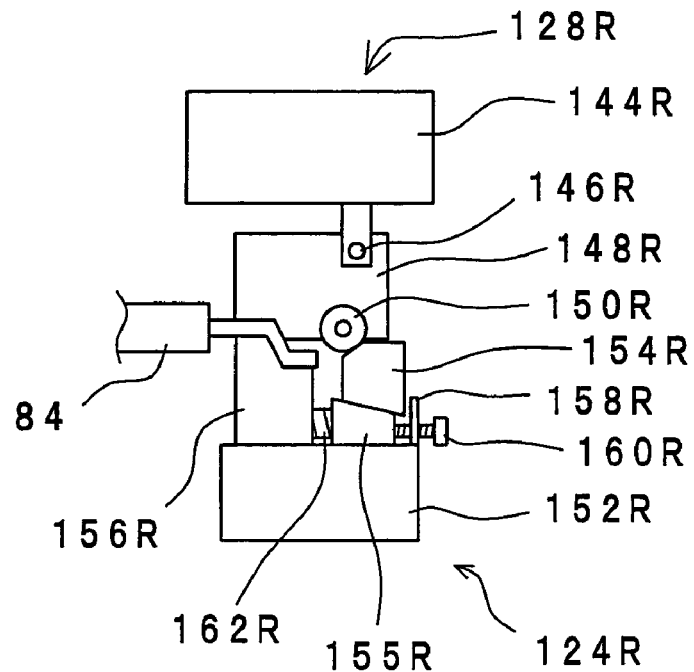
FIG. 9 is a front view of a die according to a second embodiment of the invention.

FIG. 9 shows a pair of the dies 128R, 124R at the right side in the lead forming apparatus. The dies 128L, 124L at the left side have symmetrical structures with the counterparts 128R, 124R, so the dies 128L, 124L are not shown. The top die 128R consists of a top holder 144R, a fulcrum 146R, a punch 148R and a roller 150R. This structure is similar to the counterpart in the first embodiment. On the other hand, the bottom die 124R consists of a bottom holder 152R, a die 156R, a cam 154R, a taper block 155 to be integrated with the cam 154R, a bottom plate 158R, an elastic member 162R and a screw 160R. The die 156R is fixed on the bottom holder 152R. The taper block 155R is mounted on the bottom holder 152R, so that it can be moved in the left direction in FIG. 9 by the screw 160R engaged with the bottom plate 158R fixed to an end of the bottom holder 152R. The cam 154R is mounted on the taper block 155R so as to be integrated therewith. The shapes at the tops of the die 156R and the cam 154R are similar to the die 56R and the cam plate 54R in the first embodiment. The elastic member 162R provided between the die 156R and the taper block 155R pushes the taper block 155R to the right direction. The shapes at the top plane of the taper block 155R and the bottom plane of the cam 154R are not in parallel to the top plane of the bottom holder 152R. Therefore, when the taper block 155R is moved by the screw 160R to the left or right, the position and height of the cam 154R are changed. Though not shown, the device holders 34L, 34R are fixed to the tables 22L, 22R on which the bottom dies 124L, 124R are mounted.

The operation of the above-mentioned apparatus is explained. A semiconductor device 84 is set at a predetermined position. Next, the platen 26 driven by the pressing machine 30 moves the top die 128L, 128R in contact with the semiconductor device 84 to the bottom dead center. At this time, in the right die assembly, the punch 148R is set at the desired position by the die 156R according to the relative operation of the fulcrum 146R, the punch 148R, the roller 150R and the cam 154R. Similarly in the left die assembly, the punch 148R is set at the desired position. Thus, the lead parts of the semiconductor device 84 are formed to have the desired forms.

If the lead parts do not have the desired forms, they can be adjusted without changing the components in the lead forming apparatus by changing the positions of the cam 156R and the tape block 155R with the screw 158R. For example, by adjusting the screw 160 to move towards the plate 156R at the top dead center, the taper block 155R is pushed towards the plate 156R so that the height of the cam 154R is decreased. Thus, the relative distance of the roller 150R to the cam 154R is changed, so as to bend the lead parts of the semiconductor device 64 at a shallower position. On the other hand, by adjusting the screw 160 to the outside at the top dead center, the taper block 155R is pushed back by the elastic member 162R so that the height of the cam 154R is increased. Thus, the relative distance of the roller 150R to the cam 154R is changed, so as to bend the lead parts of the semiconductor device 64 at a deeper position.

Third Embodiment

Figure 10:
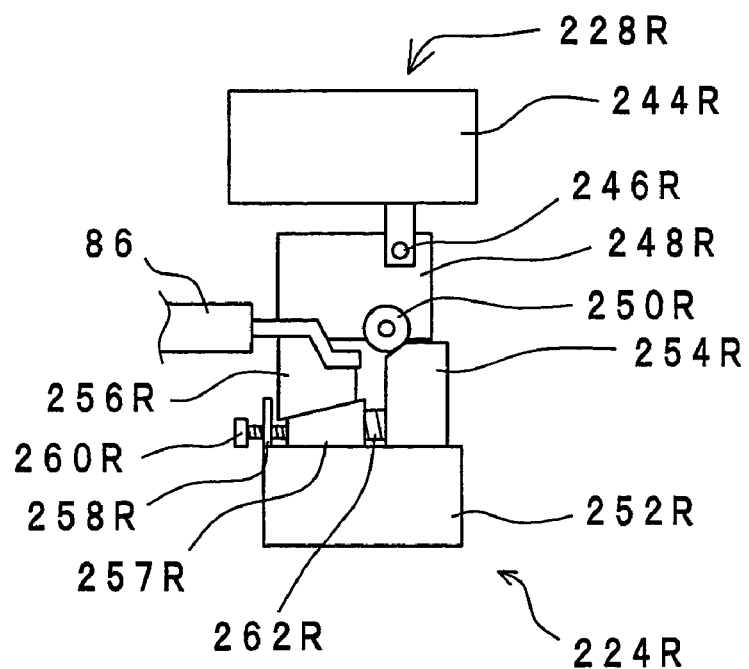
FIG. 10 is a front view of a die according to a third embodiment of the invention.

Next, a lead forming apparatus according to the third embodiment of the invention is explained. FIG. 10 is a front view of a die assembly at the right side of the lead forming apparatus. A die assembly at the left side is not shown because it has a symmetrical structure. The lead forming apparatus can adjust the die height of the bottom die.

As shown in FIG. 10, the top die 228R consists of a top holder 244R, a fulcrum 246R, a punch 248R and a roller 250R. This structure is similar to the right top die 28R in the first embodiment. On the other hand, the bottom die 224R consists of a bottom holder 252R, a cam 254R, a die 256R, a taper block 257R to be integrated with the die 256R, a plate 258R, a screw 260R and an elastic member 262R. This die 224R has a different structure from the bottom die 28R in the first embodiment. The cam 254R is fixed on the bottom holder 252R. The taper block 257R is mounted on the bottom holder 252R, so that it can be moved on the holder 252R in the left direction in FIG. 9 by the screw 260R engaged with the plate 258R fixed to an end of the bottom holder 252R. The die 256R is mounted on the taper block 257R so as to be integrated therewith. The shapes at the tops of the die 256R and the cam 254R are similar to the die 56R and the cam plate 54R in the first embodiment. The elastic member 262R is provided between the cam 254R and the taper block 257R. The elastic member 262R acts to push the taper block 257R in the backward direction. The shapes at the top plane of the taper block 257R and the bottom plane of the die 256R are not in parallel to the top plane of the bottom holder 252R. When the taper block 257R is moved by the screw 260R to the left or right, the position of the die 256R is changed. Though not shown, the device holders 34L, 34R are mounted to the tables 22L, 22R.

The operation of the above-mentioned apparatus is explained. A semiconductor device 86 is set at a predetermined position. Next, the platen 26 driven by the pressing machine 30 moves the top die 10L, 14R downward to the bottom dead center. At this time, in the right die assembly, according to the relative movement of the fulcrum 246R, the punch 248R, the roller 250R and the cam 254R, the punch 248R is set at the desired position by the die 256R. Thus, the lead parts of the semiconductor device 86 are formed to have the desired shapes. Similarly in the left die assembly, the punch 248R is set at the desired position. Thus, the lead parts of the semiconductor device 86 are formed to have the desired forms.

If the lead parts of the semiconductor device 86 do not have the desired forms, they can be adjusted without changing the components in the lead forming apparatus, by changing the position of the die 256R and the tape block 257R with the screw 260R. For example, by adjusting the screw 260 relative to the plate 258R at the top dead center, the taper block 257R is pushed towards the plate 258R so that the height of the die 256R is decreased. Thus, the relative distance of the punch 248R to the die 256R is changed, so as to bend the lead parts of the semiconductor device 86 at a deeper position. On the other hand, by adjusting the screw 260 toward the outside at the top dead center, the taper block 257R is pushed back by the elastic member 262R so that the height of the die 256R is increased. Thus, the relative distance of the punch 248R to the die 256R is changed, so as to bend the lead parts of the semiconductor device 64 at a shallower position.

Fourth Embodiment

Figure 11:
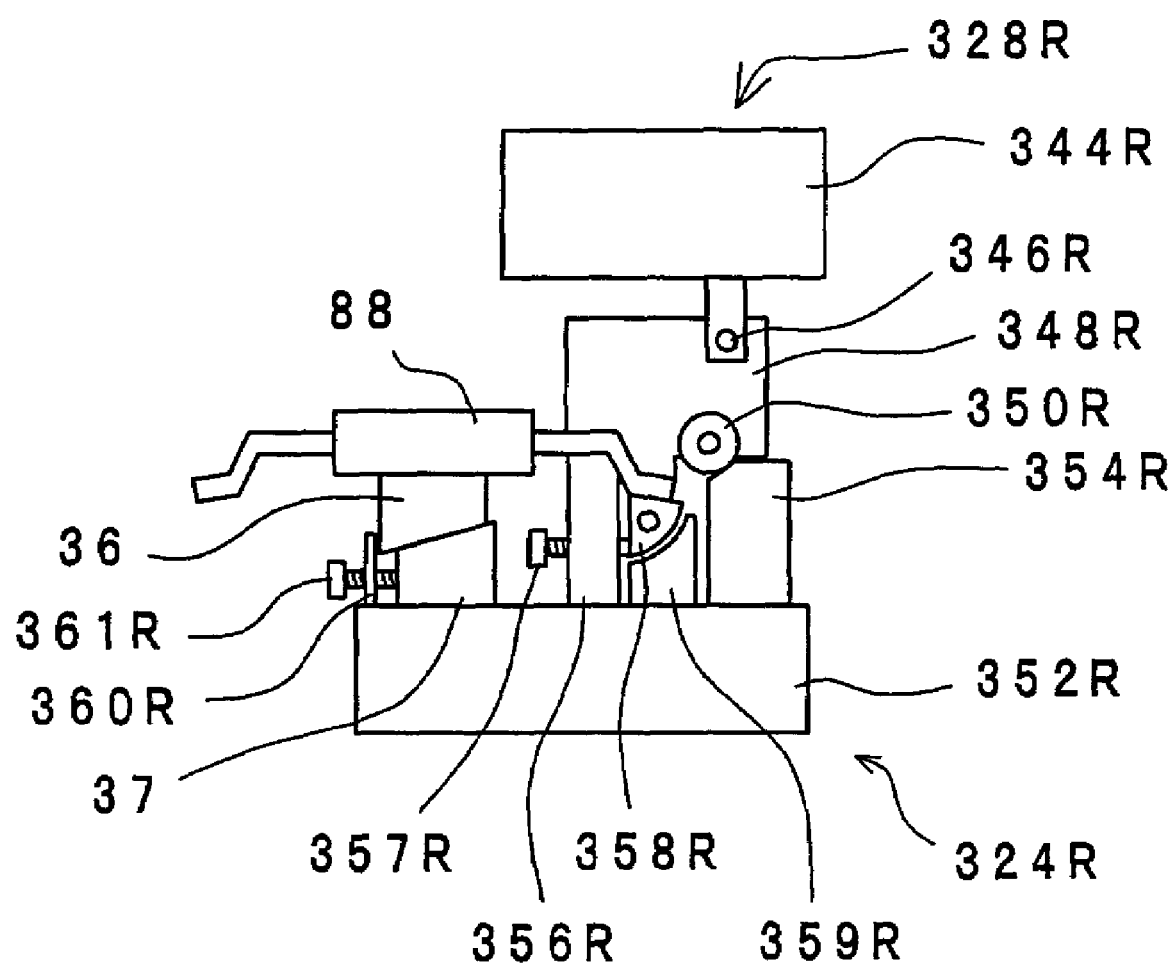
FIG. 11 is a front view of a die according to a fourth embodiment of the invention.

Next, a lead forming apparatus according to the fourth embodiment of the invention is explained. FIG. 11 is a front view of a right die assembly of the lead forming apparatus. A die assembly at the left side is not shown because it has a symmetrical structure. The lead forming apparatus can adjust the height of the semiconductor device and the bending angle of the lead parts thereof.

As shown in FIG. 11, in a top die 328R, a top holder 344R supports a punch 348R at a fulcrum 346R. Furthermore, the punch 348R has a roller 350R at the bottom thereof. The structure of the top die 328R is similar to the top die 28R in the first embodiment. In the bottom die 324R, a cam 354R is fixed on a bottom holder 352R. Furthermore, a holder 359R is provided near the cam 354R to hold a die 358R for changing the angle. A die 356R is fixed on the bottom holder 352R, and a screw 357R is provided to engaged with a screw hole provided in the die 356R in the left and right direction. On the other hand, a taper block 37 is mounted on the bottom holder 352R, so that it can be moved on the holder 352R in the left and right direction in FIG. 11 by a screw 361R engaged with a plate 360R fixed to an end of the bottom holder 352R. The shapes at the tops of the die 356R and the die 358R are formed according to the shape of the leads to be formed. Furthermore, a base 36 for holding a semiconductor device 88 is placed on the tape block 37. The shapes at the top of the taper block 37 and the bottom of the base 36 are not in parallel to the top plane of the bottom holder 352R. When the taper block 37 is moved by the screw 357R to the left or right, the position (or height) of the base 36 is changed. Though not shown, the device holders 34L, 34R are mounted to the tables 22L, 22R on which the bottom die 324 is supported. The device holders 34L, 34R hold shoulders of a resin package of the semiconductor device 88.

The operation of the above-mentioned apparatus is explained. A semiconductor device 88 is set at a predetermined position on the base 36, and the pressing machine 30 presses it to the bottom dead center. At this time, according to the relative movement of the fulcrum 346R, the punch 348R, the roller 350R and the cam 354R, the punch 348R is set at the desired position by the die 356R. Similarly in the left die assembly, the punch 348R is set at the desired position. Thus, the lead parts of the semiconductor device 88 are formed to have the desired forms.

If the lead parts of the semiconductor device 88 do not have the desired forms, they can be adjusted without changing the components in the lead forming apparatus, by adjusting the screw 357R at the top dead center to move the die 357R for changing the relative angle of the lead parts to the resin package of the semiconductor device 88. For example, by moving the screw 357R towards the inside of the die 356R, the angle at the edge of lead parts is changed towards a flat position. Similarly, by moving the screw 357R towards the outside of the die 356R, the angle at the edge of a lead part is changed to have a larger angle relative to the flat position. Thus, the relative position of the die 358R is changed by the screw 357R, so as to change the angle of the die 358R.

Furthermore, by adjusting the screw 361R at the top dead center to move the taper block 35 in the left direction in FIG. 11, the taper block 35 is moved to the left so that the height of the base 34 is set higher. Similarly, by moving the screw 361R in the right direction in FIG. 11 at the top dead center, the taper block 35 is moved to the right so that the height of the base 34 is set lower. Thus, if the tolerance of the lead position of the semiconductor device 88 is small, the above-mentioned operation can control the lead shapes within the tolerance. Therefore, the height of the semiconductor device 88 can be adjusted by changing the height of the base 34 with the screw 361R, without changing the components in the lead forming apparatus.

Fifth Embodiment

Figure 12:
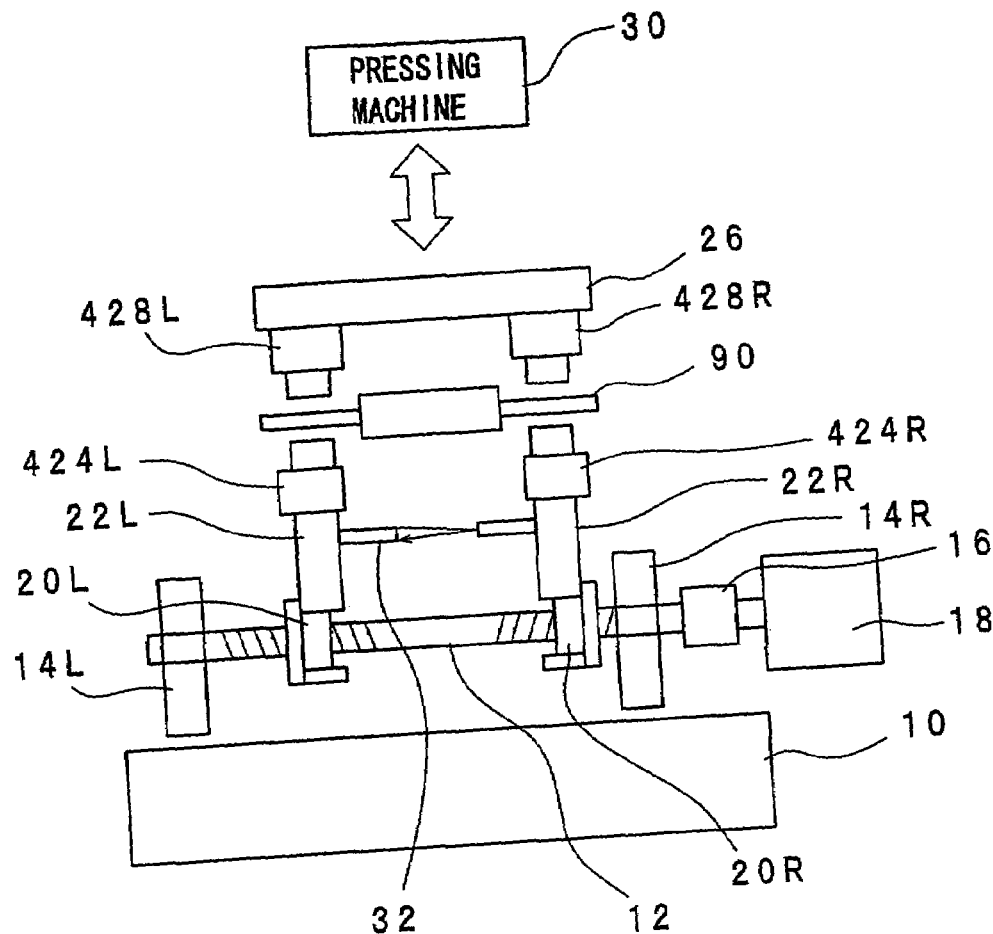
FIG. 12 is a front view of an apparatus for lead forming with cutting according to a fifth embodiment of the invention.
Figure 13:
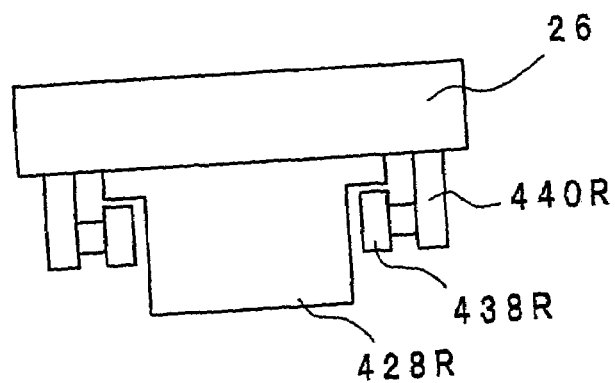
FIG. 13 is a side view of a part of the apparatus shown in FIG. 1.

FIG. 12 shows a lead forming apparatus for cutting according to the fifth embodiment of the invention. The lead forming apparatus shown in FIG. 12 is similar to the counterpart in the first embodiment shown in FIG. 1, except the dies 424R, 428R, 424L and 428L. A lead frame has comb-like lead parts connected partially to each other. The lead parts are separated with dies for cutting in the lead forming apparatus. The dies 424R, 428R, 424L and 428L having shapes similar to dents of a comb engage with each other, when viewed from a side thereof. FIG. 13 is a side view of the platen 26 and the right top die 428R. This structure is similar to the platen 26 and the right top die 428R of the first embodiment shown in FIG. 3. Though not shown, device holders 34L, 34R are fixed to the tables 22L, 22R. Alternatively, the device holders shown in FIG. 3 are used. In the example shown in FIG. 13, a pair of guide rollers 438R holding the top die 428R are supported by a pair of plates 440 fixed to both sides of the platen. Therefore, the die 428R can be moved to the left or to the right while supported by the guide rollers 438. The left top die 428 not shown is supported similarly. The controller shown in FIG. 2 is used. In the above-mentioned lead forming apparatus having dies 424R, 428R, 424L and 428L for cutting, lead cutting can be performed, without changing the dies, for semiconductor devices having the same lead forms, but having a different size of a resin package thereof.

Sixth Embodiment

Figure 14:
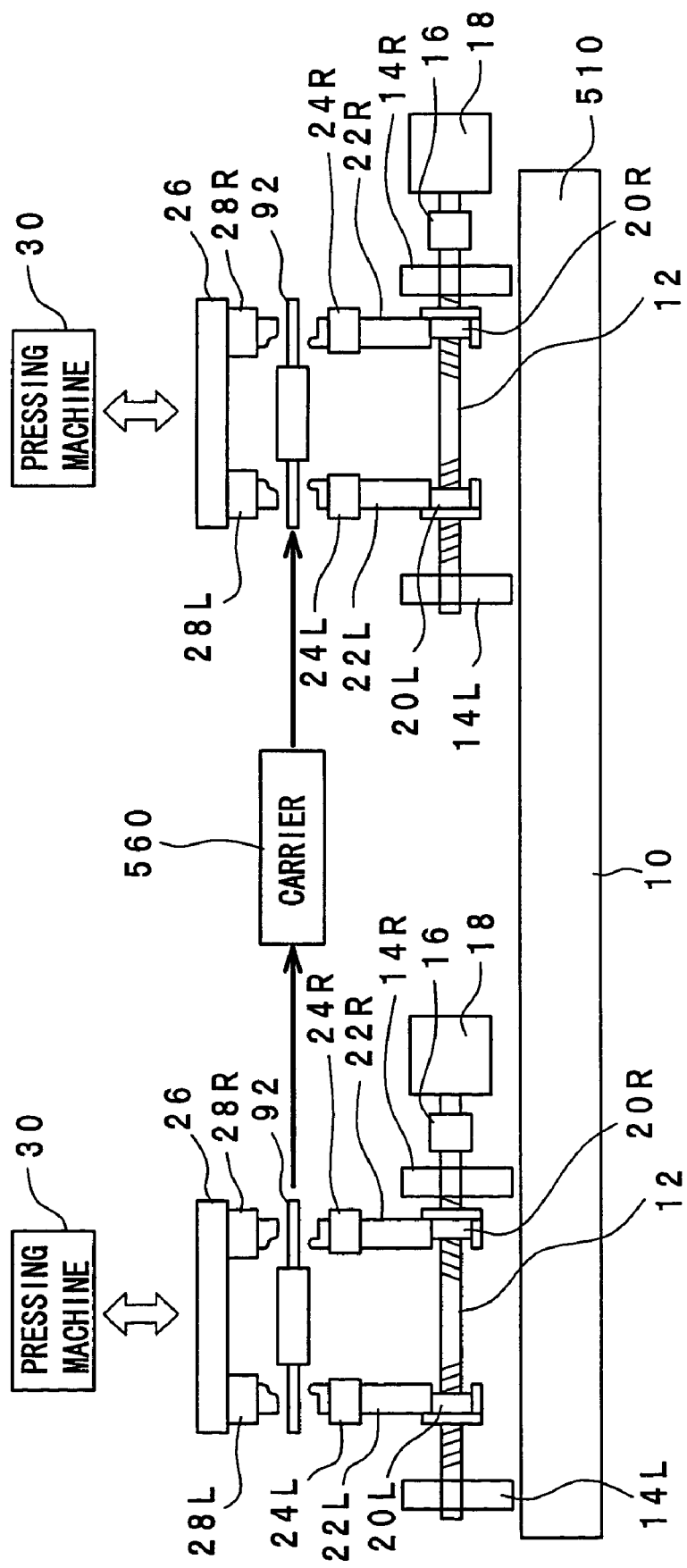
FIG. 14 is a front view of an apparatus for lead forming with bending according to a sixth embodiment of the invention.

Next, a lead forming apparatus according to the sixth embodiment of the invention is explained. It can perform lead forming for a semiconductor device having leads at all the four sides thereof. As shown in FIG. 14, the lead forming apparatus has two units shown in FIG. 1 set on a common base plane 510, and a carrier 560 is provided between them. The carrier 560 rotates by 90 degrees a semiconductor device 92 which have been formed by one of the units and carries the rotated device to the other unit. Thus, the leads of the semiconductor device at all the four sides thereof are formed.

In the lead forming, first, in the unit shown at the left in FIG. 14, the died 28L, 24L, 28R and 24R are moved by the ball screw 12 driven by the motor 18 by an amount in correspondence to a semiconductor device 92. By operating the motor, the left nut 20L and the left table 22L are moved toward or away from the right nut 20R and the right table 22R, to match the size of the semiconductor device 92. Then, the semiconductor device 92 is set on a predetermined position by a carrier (not shown). Next, the pressing machine 30 is operated to move the top dies 28L, 28R by the platen 26 downward. The top dies 28L, 28R are moved to the bottom dead center, and the semiconductor device 92 is formed to have the desired shape.

As mentioned above, the semiconductor device 92 has leads at the four sides thereof. After the leads at two sides are formed by the above-mentioned operation, the carrier 560 takes and carries the device 92 for the next step, while rotating it by 90 degrees in the horizontal plane.

In the unit shown at the right in FIG. 14, by operating the motor 18, the left nut 20L and the left table 22L are moved toward or away from the right nut 20R and the right table 22R, to match the size of the semiconductor device 92. Then, the semiconductor device 92 is set on a predetermined position on the device holders by the carrier 560. Next, the pressing machine 30 is operated to move the top dies 28L, 28R by the platen 26 downward. The top dies 28L, 28R are moved to the bottom dead center, and the semiconductor device 92 is formed to have the desired shape of the leads at the other two sides.

Thus, the leads at the four sides of the semiconductor device 92 are formed. The lead forming can be performed, without changing the components in the lead forming apparatus, for a semiconductor device having a different size of resin package.

As will be understood by a person skilled in the art, the components provided in the lead forming apparatuses of the above-mentioned embodiments can be incorporated in various way.

In a prior art lead forming apparatus, the shape of the as-formed semiconductor device is not checked at the time of lead forming. The devices are checked after production of a lot thereof is completed. Then, based on the quality control data, the dies are adjusted manually if necessary. In the embodiments explained below, each semiconductor device is measured to adjust the positions of the components in the lead forming apparatus, so that semiconductor devices of high quality can be produced.

Seventh Embodiment

Figure 15:
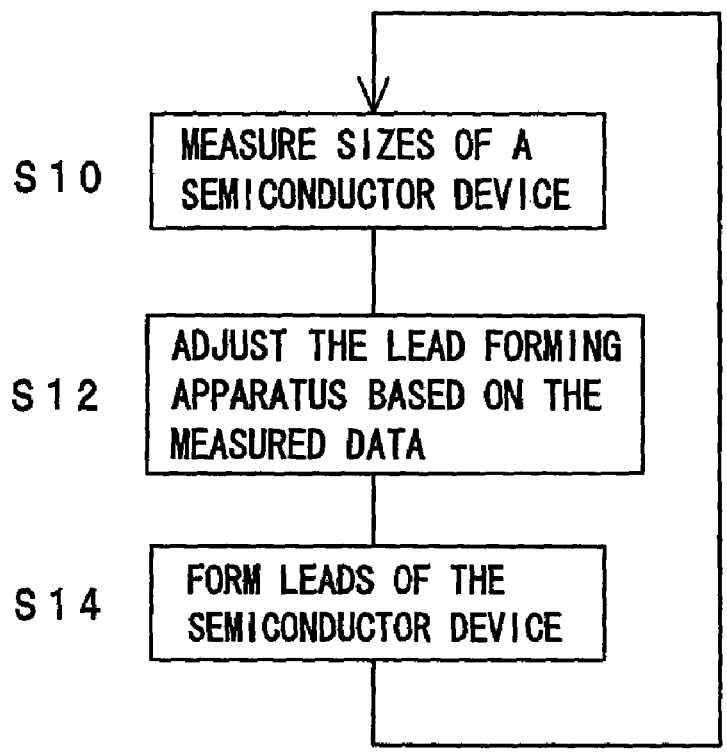
FIG. 15 is a flowchart of lead forming according to a seventh embodiment of the invention.

Next, a lead forming method according to the seventh embodiment of the invention is explained. FIG. 15 is a flowchart of lead forming by the controller 60 in the lead forming apparatus according to one of the above-mentioned embodiments. In the lead forming apparatus, the relative distance between the left and right dies can be controlled by the ball screw 12 driven by the motor 18. Furthermore, the screw 160R, 260R, 357R, 361R can be operated by drivers not shown. In lead forming, the size of a semiconductor device before lead forming is measured by a measuring device 66, and the dies and the device holders are adjusted according to the measured data. Then, the lead forming is performed.

Figure 16:
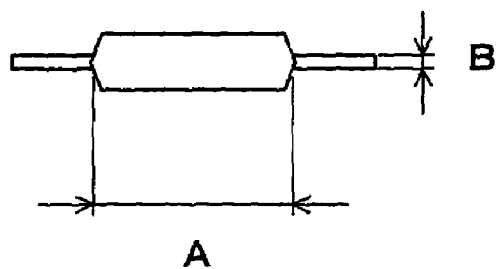
FIG. 16 is a diagram for explaining size of a semiconductor device.

The measured sizes of the semiconductor device are, for example, size A on a resin package and size B of lead thickness as shown in FIG. 16. The sizes A and B scatter among the semiconductor devices due to shrinkage of the resin or the like, so that optimization due to measured data is effective. Among the various sizes of the semiconductor device before lead forming, as to the size A on the resin package, as shown in the flow of FIG. 15, the size A is measured, and the measured data is received (S10). Next, the positions of the device holders 34L, 34R are optimized by operating the motor 18 in the lead forming apparatus by an amount based on the measured data (S12). After confirming with the sensor 32 that the device holders 34L, 34R are adjusted, the pressing machine 30 is operated for lead forming of the semiconductor device (S14). These steps are repeated. Thus, before carrying a semiconductor device, the size A of the resin package thereof is measured, and the apparatus is optimized according to the measured size. Then, lead forming is performed. Then, a semiconductor device of high precision can be produced.

Figure 6:
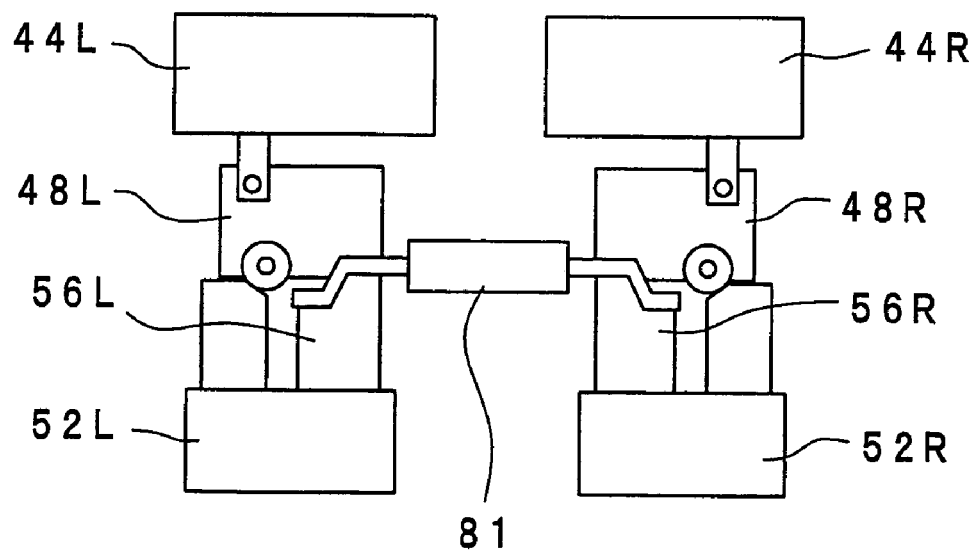
FIG. 6 is a front view of a process in the apparatus shown in FIG. 5.

Similarly, as to size B of lead thickness, in the flow shown in FIG. 15, the size B of a semiconductor device is measured before lead forming (S10). Then, based on the measured data, the position of the bottom dead center, explained with reference to FIGS. 5 and 6, is optimized (S12). Then, lead forming of the semiconductor device is performed (S14). These steps are repeated. Thus, a semiconductor device of high precision can be produced.

In the above-mentioned example, the sizes A and B shown in FIG. 16 are controlled. However, needless to say, a size to be adjusted is not limited to the sizes A and B. For example, sizes shown in FIG. 18 referred to later may be used.

In the flow shown in FIG. 15, the lead forming apparatus is controlled for each semiconductor device. However, the control may be performed for one among a predetermined amount of semiconductor devices or once per lot.

Eighth Embodiment

Next, a lead forming method according to the eighth embodiment of the invention is explained with reference to a flowchart of the controller 60 shown in FIG. 17. In the lead forming method, after leads of a semiconductor device are formed by a lead forming apparatus, sizes of the as-formed device are measured by a measurement device 66. Then the lead forming apparatus is adjusted according to the measured data for following lead forming. In an example, as shown in FIG. 18, sizes to be measured are size C of distance between two ends of the leads, size D of a distance between the bottom of a resin package and an end of the lead in the vertical direction, and angle E of the lead edge relative to the bottom plane of the resin package.

Figure 17:
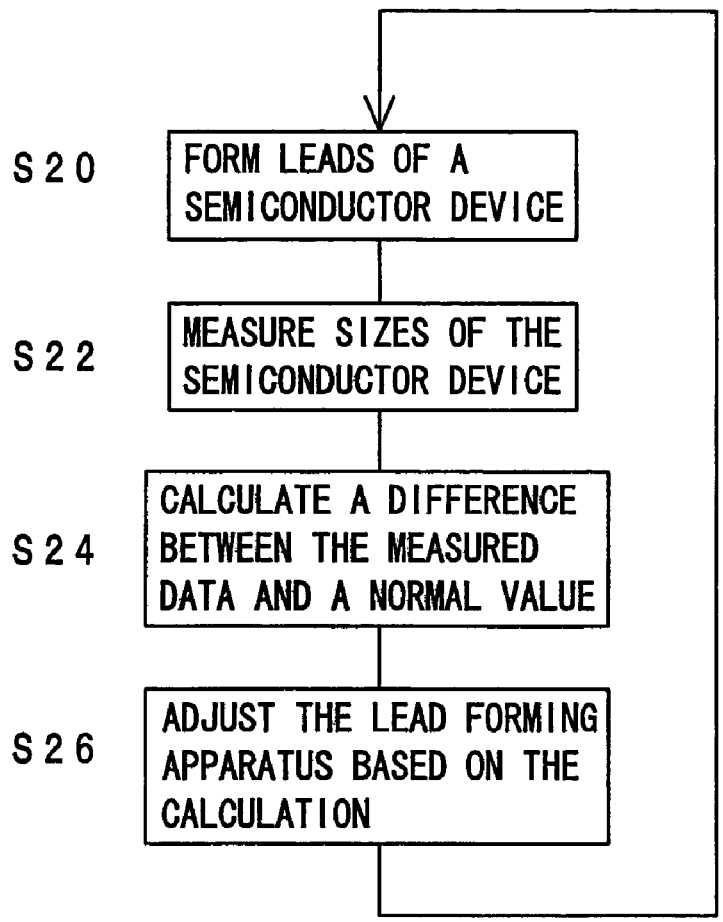
FIG. 17 is a flowchart of lead forming according to an eighth embodiment of the invention.
Figure 18:
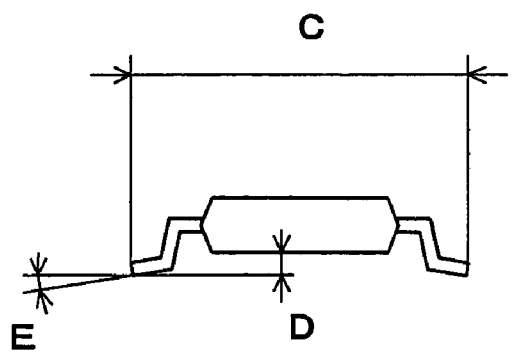
FIG. 18 is a diagram for explaining a size of a semiconductor device.

In the flow shown in FIG. 17, after the pressing machine 30 is operated to form leads of a semiconductor device (S20), the sizes of the as-formed semiconductor device are measured to receive the measured data (S22). The measured data may be an average of the measured data of a plurality of semiconductor devices. Then, a difference between the measured data and a normal value is calculated (S24), and the apparatus is adjusted according to the difference, for example, on the position of the screw 160R, 260R, 357R, 361R (S24), for the feedback for the lead forming of a next semiconductor device.

For example, size E of a semiconductor device is measured after the semiconductor device is formed by the lead forming apparatus, and a difference between the measured data and the normal value is calculated by the controller 60, and the positions of the dies in the apparatus are adjusted according to the difference. Then, a next semiconductor device is formed by the adjusted apparatus. For example, if the measured size E is smaller than the normal value, the die 358R for changing the angle in the lead forming apparatus shown in FIG. 11 is adjusted to have an optimum position. Similarly, as to sizes C and D, if they are different from the normal values, the punch 248R in the lead forming apparatus shown in FIG. 11 or the die 256R in the lead forming apparatus shown in FIG. 10 is adjusted. Then, a next semiconductor device is formed with the adjusted apparatus. Thus, a semiconductor device of high quality can be produced. In the above-mentioned example, the sizes C, D and E shown in FIG. 18 are controlled, but needless to say, a size to be measured is not limited to the sizes C–E.

As explained above, a plurality of types of semiconductor devices can be formed by the above-mentioned lead forming apparatus. Thus, the lead forming apparatus can be adjusted automatically according to the type of semiconductor device. Further, investment cost therefor can be reduced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of forming leads of a packaged semiconductor device that includes a package having opposed first and second sides and first and second leads extending outwardly from the first and second sides of the package, respectively, the method comprising:

adjusting separation between first and second bottom dies to receive the package of the packaged semiconductor device between the first and second bottom dies, the first and second bottom dies having respective top surfaces that include oblique portions;

placing the package of the packaged semiconductor device between the first and second bottom dies with the first and second lead proximate the top surfaces of the first and second bottom dies, respectively;

moving at least one of the first and second bottom dies and first and second top dies having respective bottom surfaces with oblique portions complementary to the top surfaces of the first and second bottom dies, respectively, toward each other;

clamping the first and second leads between the top and bottom surfaces of the first top and bottom dies and between the second top and bottom dies, respectively, and urging the first top and bottom dies and the second top and bottom dies together, thereby forming the first and second leads, and, simultaneously, producing lateral forces through contact of the complementary top and bottom surfaces and the first and second leads, and, in response to the lateral forces, moving the first and second top dies laterally, relative to the first and second bottom dies, thereby changing separation between the first and second top dies.

2. The lead forming method according to claim 1, wherein the top surfaces of the first and second bottom dies apply cam forces to the first and second top dies, and the first and second top dies roll laterally in response to the cam forces.

3. The lead forming method according to claim 2, including, before clamping the first and second leads, adjusting separations between the top surfaces of the first and second bottom dies and the bottom surfaces of the first and second top dies.

4. The lead forming method according to claim 1, including, before clamping the first and second leads, adjusting separations between the top surfaces of the first and second bottom dies and the bottom surfaces of the first and second top dies.

5. The lead forming method according to claim 1, wherein the top surfaces of the first and second bottom dies include respective separate first and second portions for contacting proximal and distal portions of the first and second leads, respectively, the method including, before clamping the first and second leads, adjusting the second portions of the top surfaces of the first and second bottom dies to adjust an angle at which the first and second leads are formed.

6. The lead forming method according to claim 1 including supporting the package of the packaged semiconductor device between the first and second bottom dies before clamping the first and second leads, without directly placing the first and second leads on the top surfaces of the first and second bottom dies.

7. The lead forming method according to claim 1, including, before clamping the first and second leads, detecting the separation between the first and second bottom dies and adjusting the separation between the first and second bottom dies in response to the separation detected.

8. The lead forming method according to claim 1, wherein the package of the packaged semiconductor device includes opposed third and fourth sides, transverse to the first and second sides, and third and fourth leads extending outwardly from the third and fourth sides, respectively, the method comprising:

after forming the first and second leads, releasing the first and second leads from the first and second top and bottom dies and removing the first and second leads from the first and second top and bottom dies;

rotating the packaged semiconductor device 90°, placing the third and fourth leads opposite the top surfaces of the first and second bottom dies, respectively; and repeating the moving, clamping, and urging with the third and fourth leads, thereby forming the third and fourth leads.

* * * * *